(12) United States Patent
De Luis et al.

(10) Patent No.: US 9,438,197 B2
(45) Date of Patent: Sep. 6, 2016

(54) RECONFIGURABLE MULTI-BAND FILTER

(75) Inventors: Javier Rodriguez De Luis, Kirkland, WA (US); Alireza Mahanfar, Redmond, WA (US); Benjamin J. Shewan, Redmond, WA (US); Stanley Yu Tao Ng, Bellevue, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 194 days.

(21) Appl. No.: 13/457,026

(22) Filed: Apr. 26, 2012

(65) Prior Publication Data

US 2013/0285862 A1 Oct. 31, 2013

(51) Int. Cl.
*H03H 7/01* (2006.01)
*H01Q 1/24* (2006.01)

(52) U.S. Cl.
CPC ............ *H03H 7/0153* (2013.01); *H01Q 1/243* (2013.01); *H03H 2007/013* (2013.01); *H03H 2250/00* (2013.01)

(58) Field of Classification Search
CPC ............. H03H 7/0161; H03H 7/1775; H03H 7/0153; H03H 7/1791
USPC ........................................................ 343/722
See application file for complete search history.

(56) References Cited

U.S. PATENT DOCUMENTS

| | | | |
|---|---|---|---|
| 4,423,396 A * | 12/1983 | Makimoto | H01P 1/20363 333/168 |
| 6,453,157 B1 * | 9/2002 | Roberts | 455/337 |
| 7,015,870 B2 * | 3/2006 | Guitton et al. | 343/860 |
| 7,062,249 B2 * | 6/2006 | Park et al. | 455/335 |
| 7,148,754 B2 | 12/2006 | Kaminski | |
| 7,164,897 B2 | 1/2007 | Manku et al. | |
| 2004/0242175 A1 | 12/2004 | Lin | |
| 2005/0148312 A1 * | 7/2005 | Toncich | H03H 7/0161 455/339 |
| 2008/0106476 A1 * | 5/2008 | Tran et al. | 343/702 |
| 2008/0238789 A1 * | 10/2008 | Wilcox | 343/750 |
| 2010/0164649 A1 * | 7/2010 | Toncich et al. | 333/174 |
| 2011/0241802 A1 | 10/2011 | Joshi et al. | |

OTHER PUBLICATIONS

Smitha, et al., "A Reconfigurable Low Complexity Architecture for Channel adaptation in Cognitive radio", Retrieved at <<http://ieeexplore.ieee.org/ielx5/4674453/4699392/04699608.pdf?tp=&arnumber=4699608&isnumber=4699392>>, Proceedings of IEEE 19th International Symposium on Personal, Indoor and Mobile Radio Communications, (PIMRC 2008), Sep. 15, 2008, pp. 1-5.

(Continued)

*Primary Examiner* — Sue A Purvis
*Assistant Examiner* — Daniel J Munoz
(74) *Attorney, Agent, or Firm* — Judy Yee; Micky Minhas

(57) ABSTRACT

Reconfigurable multi-band filter techniques are described. In one or more implementations a device includes a radiating structure and a filter connected to the radiating structure configured to filter wireless signals received by the radiating structure. The filter includes switchable resonators configured to tune to different frequency bands and tunable capacitors configured to tune to different frequencies within the different frequency bands.

19 Claims, 8 Drawing Sheets

(56) References Cited

OTHER PUBLICATIONS

Ito, et al., "A Tunable Wideband Frequency Synthesizer Using LC-VCO and Mixer for Reconfigurable Radio Transceivers", Retrieved at <<http://downloads.hindawi.com/journals/jece/2011/361910.pdf>>, Proceedings: Hindawi Publishing Corporation Journal of Electrical and Computer Engineering vol. 2011, Jun. 6, 2011, pp. 1-7.

Nguyen, Clark, -C.T., "Vibrating RF MEMS Overview: Applications to Wireless Communications", Retrieved at <<http://citeseerx.ist.psu.edu/viewdoc/download?doi=10.1.1.126.8619&rep=rep1&type=pdf >>, Proceedings: Proceedings of SPIE: Micromachining and Microfabrication Process Technology, vol. 5715, Photonics West: MOEMS-MEMS 2005, Jan. 22, 2005, pp. 11-25.

Lugo, et al., "Dual-Mode Reconfigurable Filter With Asymmetrical Transmission Zeros and Center Frequency Control", Retrieved at <<http://ieeexplore.ieee.org/ielx5/7260/35454/01683805.pdf? tp=&arnumber=1683805&isnumber=35454>>,Proceedings of IEEE Microwave and Wireless Components Letters, vol. 16, No. 9, Sep. 2006, pp. 499-501.

* cited by examiner

RECONFIGURABLE MULTI-BAND FILTER

BACKGROUND

The functionality that is provided by devices, including mobile devices, is ever increasing. For example, mobile devices such as telephones were initially configured to simply operate as a telephone. Functionality was then added to include processors capable of executing applications on the device itself, maintain calendars, provide a variety of different messaging techniques (e.g., email, SMS, MMS, instant messaging), and so on.

Consequently, the mobile device may be configured to support a variety of different communication techniques over different frequency bands, such as a telephone network to engage in a wide area network wireless connection as well as local area network wireless connection, such as through one or more standards in compliance with IEEE 802.11.

Traditional techniques that were utilized to support this wireless communication using a single antenna, however, relied on separate filters that were specifically tuned to support a particular technique. Thus, design of the mobile device may be constrained using traditional techniques that involved inclusion of a separate filter for each of the wireless communication techniques supported by the device.

SUMMARY

Reconfigurable multi-band filter techniques are described. In one or more implementations, a device includes a radiating structure and a filter coupled to the radiating structure that is configured to tune to frequencies within different frequency bands. The filter includes switchable resonators to tune to the different frequency bands and tunable capacitors to tune to the frequencies within the different frequency bands.

In one or more implementations, a wireless signal is received via a radiating structure of an antenna of a device and is filtered using a single filter. The single filter is configured to tune to a first frequency within a first frequency band of the wireless signal. The single filter may then be reconfigured to tune to a second frequency within a second frequency band of the wireless signal that does not overlap with the first frequency band. The wireless signal may then be filtered using the single filter that is reconfigured to tune to the second frequency.

In one or more implementations, an apparatus includes an antenna including a radiating structure and a single filter that is communicatively connected to the radiating structure. The single filter is configured to tune to different frequency bands using switchable resonators and different frequencies within the different frequency bands using tunable capacitors. The apparatus also includes a logic control module that is connected to the single filter that is configured to activate the switchable resonators to tune to the different frequency bands and the tunable capacitors to tune to the different frequencies within the different frequency bands.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digits of a reference number identifies the figure in which the reference number first appears. The use of the same reference numbers in different instances in the description and the figures may indicate similar or identical items. Entities represented in the figures may be indicative of one or more entities and thus reference may be made interchangeably to single or plural forms of the entities in the discussion.

DETAILED DESCRIPTION

Overview

Features are continually added to devices which may complicate configuration of the device, especially for mobile use. One such example is the continued expansion of wireless signal techniques that may be incorporated by the device, such as to communicate with another device. When a single antenna is used, these techniques conventionally involved use of a separate filter for each frequency range that was to be supported by the device, such as to support local and wide area wireless networks. Consequently, design of devices that support multiple wireless signal techniques may be constrained by the filters used by these techniques.

Reconfigurable multi-band filters are described. In one or more implementations, a filter may be designed to support multiple different frequency bands for multiple different wireless signal techniques received by an antenna. For example, the antenna may receive wireless signals for, and the filter may be tuned to filter the received wireless signals for, cellular networks (2G/3G/4G) near field communication (NFC), short-range wireless connections (e.g., Bluetooth), local area wireless networks (e.g., one or more standards in compliance with IEEE 802.11), wide area wireless networks (e.g., one or more standards in compliance with IEEE 802.16, wireless telephone networks), and so on.

In one example, the filter is configured so support dynamic tuning to filter a wireless signal received from a radiating structure. The filter, for instance, may include switchable resonators and tunable capacitors configured to tune to frequencies within different frequency bands to filter a wireless signal. In conventional approaches, multiple separate filters were used to tune to frequencies within different frequency bands to filter a wireless signal. These filters were switched in or out of the signal path by using switches having a high number of output ports. By reconfiguring the filter, however, a single filter may be used to tune to frequencies within the different frequency bands. Further discussion of reconfigurable multi-band filters may be found in relation to the following sections.

In the following discussion, an example environment is first described that may employ the techniques described herein. Example procedures are then described which may be performed in the example environment as well as other environments. Consequently, performance of the example procedures is not limited to the example environment and the example environment is not limited to performance of the example procedures.

Example Environment

Figure 1:
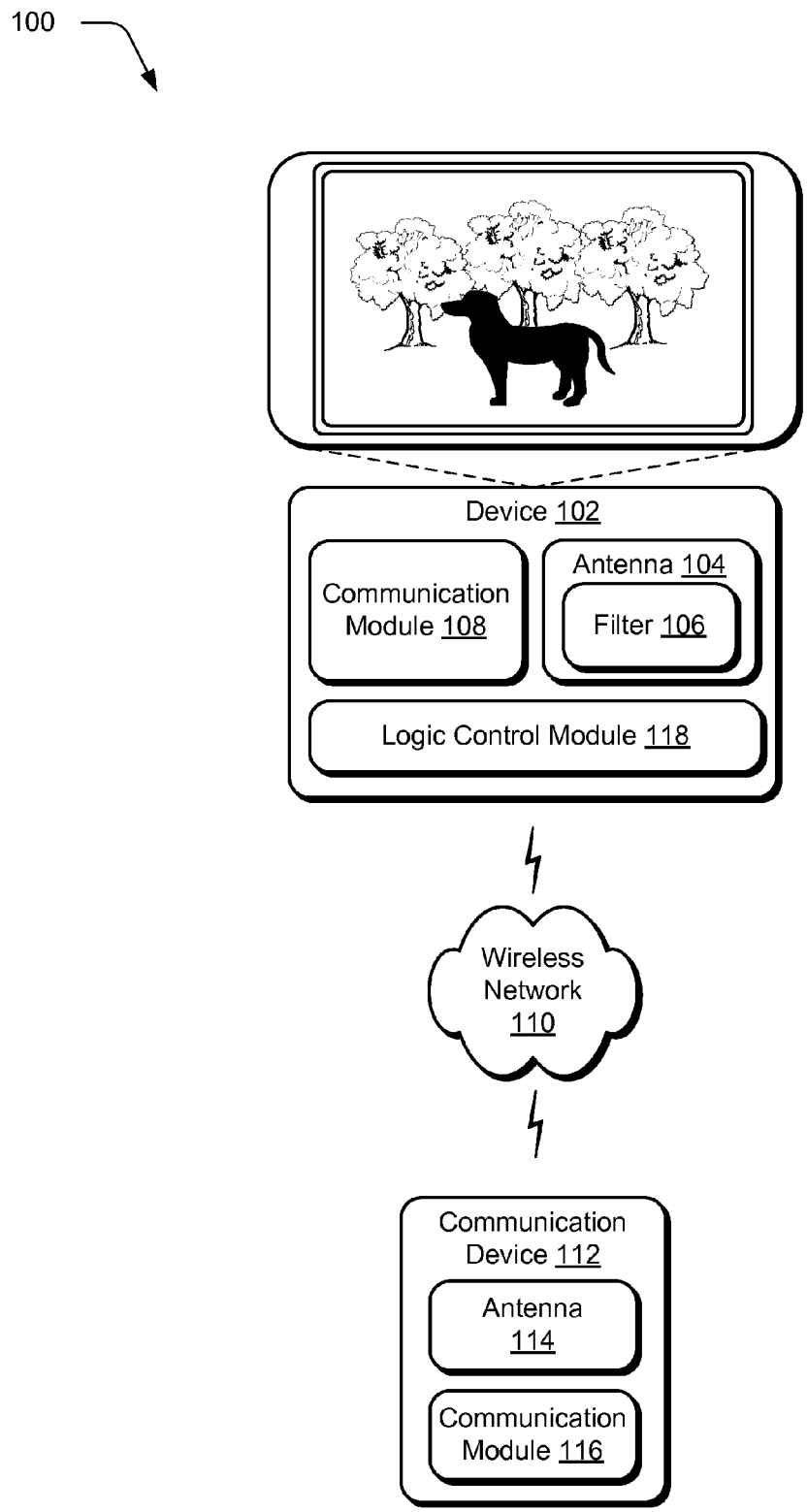
FIG. 1 is an illustration of an environment in an example implementation that is operable to employ reconfigurable multi-band filter techniques described herein.

FIG. 1 is an illustration of an environment 100 in an example implementation that is operable to employ reconfigurable multi-band filter techniques described herein. The illustrated environment 100 includes a device 102, which may be configured as an electrical device that includes an antenna 104 having a filter 106. The antenna 104 is configured to support a plurality of different wireless signal techniques in conjunction with the filter 106, which is configured to filter wireless signals received by the antenna 104.

Although the device 102 is illustrated as a mobile device (e.g., a mobile communications device such as a wireless phone or tablet computer), the device 102 may assume a wide variety of configurations. For example, the device 102 may be configured as a computing device such as a computer that is capable of wireless communication, such as a desktop computer, a mobile station, an entertainment appliance, a set-top box communicatively coupled to a display device, a wireless phone, a game console, and so forth. The device 102 may also assume a variety of other electrical configurations, such as a portable device such as a game controller, remote control device, input/output device, peripheral device, and so on.

Thus, the device 102 may range from full resource devices with substantial resources (e.g., personal computers, game consoles) to a low-resource device with limited resources (e.g., remote controls for televisions, game controller, and so forth). Additionally, although a single device 102 is shown, the device 102 may be representative of a plurality of different devices, such as a remote control and set-top box combination, a game controller and game console, and so on.

The device is illustrated as including a communication module 108. The communication module 108 is representative of functionality of the device 102 to employ one or more wireless communication techniques, such as to communicate via a wireless network 110 with a communication device 112. The communication module 108, for instance, may be configured to support one or more wireless communication techniques. These wireless communication techniques may be configured in a variety of different ways, such as to support near field communication (NFC), short range wireless communication (e.g., Bluetooth), local area wireless networks (e.g., one or more standards in compliance with IEEE 802.11), wide area wireless networks (e.g., one or more standards in compliance with IEEE 802.16, wireless telephone networks including 3G, 4G, LTE, GSM, CDMA), and so forth.

For example, the communication module 108 may be configured to employ the antenna 104 to send and/or receive signals communicated via the wireless network 110 with one or more other devices, such as communication device 112. To support this communication, the communication device 112 is illustrated as also including an antenna 114 and communication module 116 that may be configured to be the same as, or different from the communication module 108 and antenna 104 of the device 102. In one or more implementations described herein, the communication module 108 may employ the antenna 104 for a plurality of different wireless communication techniques, e.g., techniques that involve different frequency ranges as described above. Thus, a single antenna 104 may be employed by the device 102, thereby expanding configuration options of the device 102 over conventional techniques that involved a separate antenna for each technique.

In one or more implementations, the filter 106 may also be employed to support the plurality of different wireless signal techniques, such as by filtering a wireless signal received by the antenna 104. As described above, the antenna 104 may receive wireless signals at different frequency ranges. To support a particular wireless communication technique, filter 106 may be configured to tune to a particular frequency within a frequency range corresponding to the particular technique. Thus, wireless signals at the particular frequency may pass through filter 106 for output while other wireless signals received by antenna 104 are filtered (e.g., blocked).

In the illustrated example, device 102 also includes logic control module 118. Logic control module 118 may be configured to activate components of filter 106 to tune to the particular frequency. Additionally, logic control module 118 may activate the components to reconfigure filter 106. In this way, filter 106 may be configured to tune to a different frequency (within the same frequency range or within a different frequency range) to filter the wireless signal and thereby support a different wireless communication technique. Thus, a single filter 106 may be reconfigured to support multiple wireless communication techniques, further discussion of which may be found in relation to FIG. 2.

Generally, any of the functions described herein can be implemented using software, firmware, hardware (e.g., logic circuitry), or a combination of these implementations. The terms "module," "functionality," and "logic" as used herein generally represent software, firmware, hardware, or a combination thereof. In the case of a software implementation, the module, functionality, or logic represents program code that performs specified tasks when executed on a processor (e.g., CPU or CPUs). The program code can be stored in one or more computer readable memory devices. The features of the techniques described below are platform-independent, meaning that the techniques may be implemented on a variety of commercial computing platforms having a variety of processors.

For example, the device 102 may also include an entity (e.g., software) that causes hardware of the device 102 to perform operations, e.g., processors, functional blocks, and so on. For example, the device 102 may include a computer-readable medium that may be configured to maintain instructions that cause the computing device, and more particularly hardware of the device 102 to perform operations. Thus, the instructions function to configure the hardware to perform the operations and in this way result in transformation of the hardware to perform functions. The instructions may be provided by the computer-readable medium to the device 102 through a variety of different configurations.

One such configuration of a computer-readable medium is signal bearing medium and thus is configured to transmit the instructions (e.g., as a carrier wave) to the hardware of the computing device, such as via a network. The computer-readable medium may also be configured as a computer-readable storage medium and thus is not a signal bearing medium. Examples of a computer-readable storage medium include a random-access memory (RAM), read-only memory (ROM), an optical disc, flash memory, hard disk memory, and other memory devices that may use magnetic, optical, and other techniques to store instructions and other data.

Figure 2:
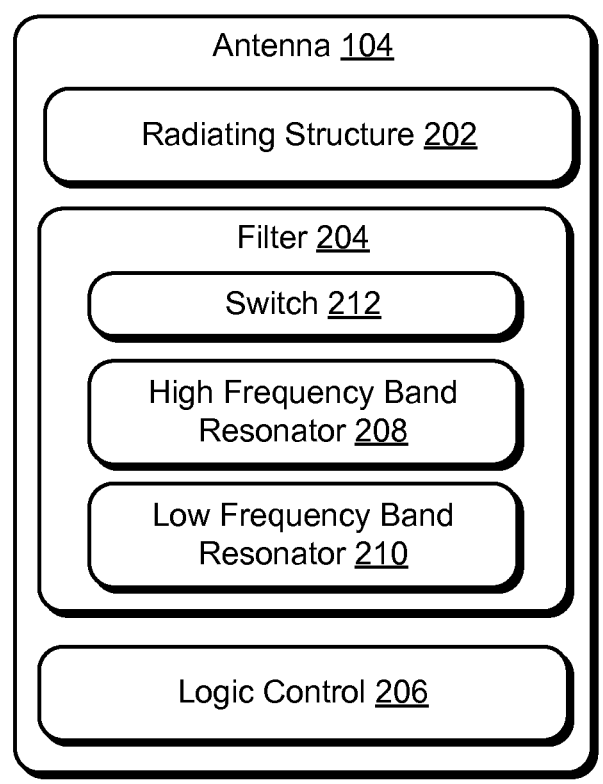
FIG. 2 is an illustration of a system in an example implementation showing an antenna including a filter of FIG. 1 in greater detail.

FIG. 2 is an illustration of a system 200 in an example implementation showing the antenna 104 of FIG. 1 in greater detail. The antenna 104 in this example is illustrated as including a radiating structure 202, a filter 204, and a logic control module 206. The radiating structure 202 may be configured, for instance, to transmit or receive a wireless signal, such as to support various wireless communication techniques.

In the illustrated example, the antenna 104 employs filter 204 having high frequency band resonators 208 and low frequency band resonators 210 that may be used to filter wireless signals received by the radiating structure 202. Filter 204 is further illustrated as including one or more switches 212 to switch between the high frequency band resonators 208 and the low frequency band resonators 210. The logic control module 206 of antenna 104 may be coupled to the filter 204 and configured to activate the high frequency band resonators 208, the low frequency band resonators 210, and the switches 212 to perform the tuning Filter 204 may also include tunable capacitors and tunable inductors (not shown) to tune to particular frequencies within the different frequency bands.

It should be noted that 'high' and 'low' as used herein, indicate a relative disposition of the aspects described as being 'high' or 'low' relative to other comparable aspects. For example, a 'low' frequency band may be said to represent a range of frequencies that is lower than those represented by a 'high' frequency band. However, the 'low' frequency band and the 'high' frequency band may both represent ranges of frequencies that are higher than those represented by a third frequency band. The third frequency band, for instance, may represent a range of frequencies that is substantially lower than those represented by either the 'low' frequency band or the 'high' frequency band. Further, the 'low' frequency band and the 'high' frequency band may also represent ranges of frequencies that are lower than those represented by the third frequency band.

In one or more implementations, the switches 212, the high frequency band resonators 208, and the low frequency band resonators 210 may be used to tune to a particular frequency band. Additionally, tunable capacitors may be employed by the filter 204 and activated by the logic control module 206 to further tune to a particular frequency within the tuned frequency band. Thus, the switchable resonators (e.g., the high frequency band resonators 208 and the low frequency band resonators 210) may be used to 'coarse tune' filter 204, and the tunable capacitors used to 'fine tune' tune filter 204. In this way, certain wireless signals received by the radiating structure 202 may be passed through filter 204 and other wireless signals filtered based on tuning the components of filter 204.

The low band resonators 210, for instance, may be activated by the logic control module 206 to tune to a frequency band, such as a 'low' frequency band that covers a 'low' range of frequencies. Tunable capacitors of filter 204 may be activated, as described above, to tune to a particular 'low' frequency within the 'low' frequency band. As previously discussed, filter 204 may be dynamically reconfigured to tune to a different frequency. For example, the logic control module 206 may activate the tunable capacitors to tune to a different 'low' frequency within the 'low' frequency band.

Alternately, logic control module 206 may activate switches 212 to use the high frequency band resonators 208. By switching to the high frequency band resonators 208, filter 204 may be tuned to a 'high' frequency band covering a range of frequencies that is relatively higher than the range of frequencies covered by the 'low' frequency band. In some embodiments, the 'high' frequency band may not overlap the 'low' frequency band. With filter 204 tuned to the 'high' frequency band, the tunable capacitors may be activated by logic control module 206 to tune filter 204 to a particular frequency within the 'high' frequency band. Thus, filter 204 may be tuned to multiple frequencies in different frequency bands without using an additional filter. An example system showing examples of the high frequency band resonators 208, the low frequency band resonators 210, and the switches 212 may be found in relation to the following figure.

Figure 3:
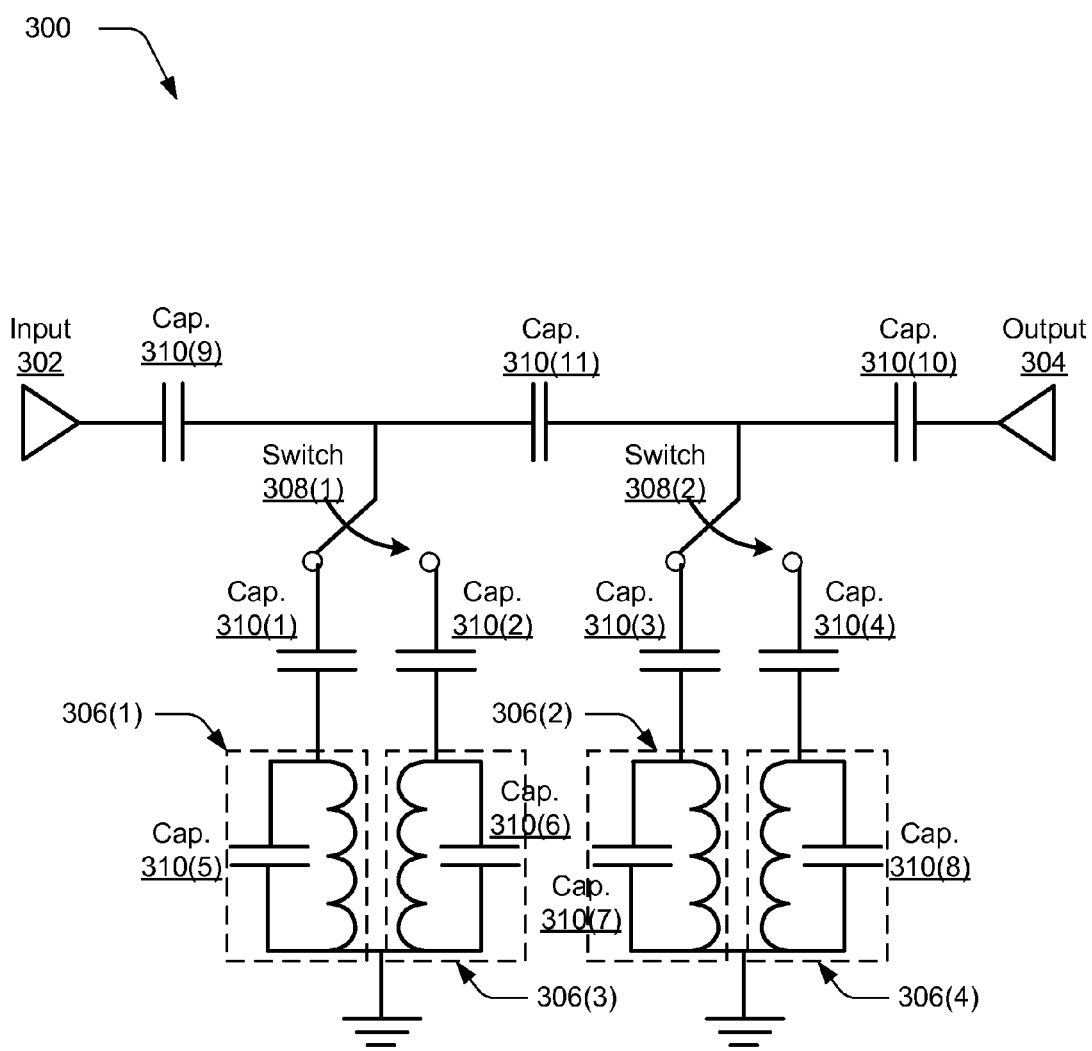
FIG. 3 depicts a system in an example implementation showing the filter of FIG. 2 as including tunable capacitors and switching elements to dynamically tune the filter to particular frequencies within different frequency bands.

FIG. 3 depicts a system 300 in an example implementation showing the filter 204 as including tunable capacitors to dynamically tune the filter to particular frequencies within the different frequency bands. In this example, system 300 includes an input 302, an output 304, and switchable resonators 306(1)-306(4) electrically coupled to the switches 308(1), 308(2).

Switchable resonators 306(1), 306(2), for instance, may correspond to the high frequency band resonators 208 of FIG. 2. Additionally, switchable resonators 306(3), 306(4) may correspond to the low frequency band resonators 210 of FIG. 2. The switches 308(1), 308(2) may be configured in a variety of ways, such as single pole, double throw (SPDT) switches, as multiple pole, multiple pole (XPXT) switches, and so on that are configured to select between the switchable resonators 306(1)-306(4). For example, the switches 308(1), 308(2) may be used to select between switchable resonators 306(1), 306(2) to tune to a 'high' frequency band or to select switchable resonators 306(3), 306(4) to tune to a 'low' frequency band. It should be noted that additional switchable resonators may be employed in system 300 to tune to additional frequency bands by using a higher number of throw switches.

System 300 also includes multiple capacitors 310(1)-310(11). Some of the multiple capacitors 310(1)-310(11), such as capacitors 310(1)-310(8), may be tunable capacitors and, as described above in more detail, configured for 'fine tuning' to a particular frequency within a frequency band. Other capacitors, such as capacitors 310(9), 310(10), may be configured as direct current (DC)-blocking capacitors disposed at the input 302 and output 304 of the system 300. While still other capacitors, such as capacitor 310(11), may be common capacitors disposed in series in the RF path to provide coupling between resonators 306(1), 306(3) and resonators 306(2), 306(4). In one or more implementations, common capacitors may correspond to the different frequency bands covered by system 300.

In one or more implementations, system 300 may receive a wireless signal at input 302, such as an unfiltered wireless signal from the radiating structure 202 of FIG. 2. The received wireless signal may be filtered using the switchable resonators 306(1)-306(4) and tunable capacitors 310(1)-310 (8). For example, switchable resonators 306(1), 306(2) may be selected by switches 308(1), 308(2) to tune to a 'high' frequency band. Alternately, switchable resonators 306(3), 306(4) may be selected by switches 308(1), 308(2) to tune to a 'low' frequency band. Further, the tunable capacitors 310(1)-310(8) may be used to tune to a particular frequency within the 'high' frequency band or the 'low' frequency band. Thus, the system 300 may output a filtered wireless signal at output 304, such that wireless signals at the tuned frequency are passed through the filter while other frequencies are blocked (i.e., filtered).

Figure 4:
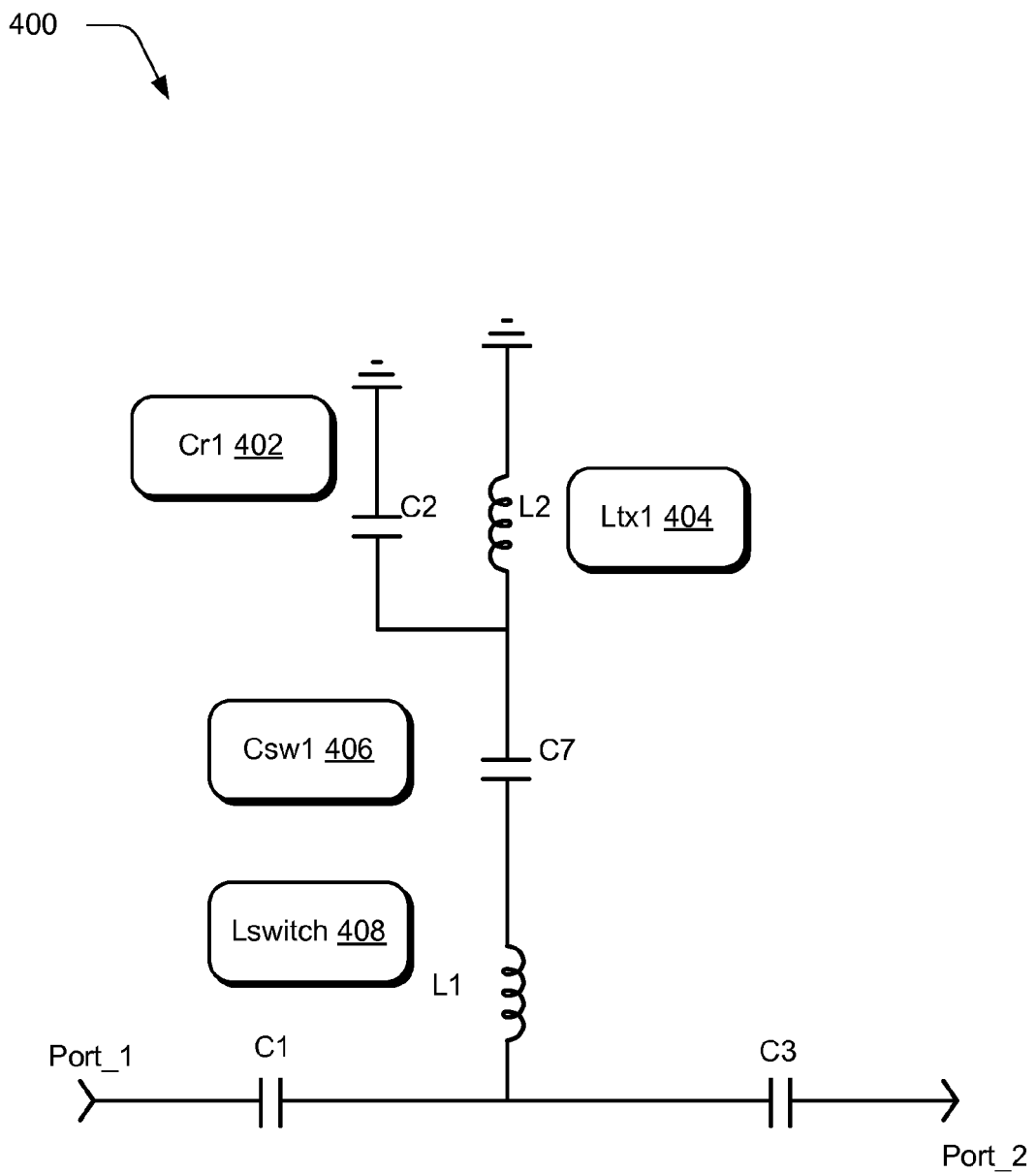
FIG. 4 depicts a system in an example implementation showing a portion of the filter illustrated in FIG. 2, where the switch has been replaced by a parasitic inductor equivalent to the switch.

FIG. 4 depicts a system 400 in an example implementation showing a portion of the filter illustrated in FIG. 2 where the switch element has been replaced by a parasitic inductor equivalent to the switch. System 400, for instance, may correspond to one or more components of FIG. 2 including high band resonators 208 or low band resonators. In the illustrated example, system 400 includes tunable capacitor ('Cr1') 402 and inductor ('Ltx1') 404 that may be referred to jointly as the 'LC tank'. System 400 is also illustrated as including a series capacitor ('Csw1') 406 and Lswitch 408 that corresponds to a parasitic inductor equivalent to the switch. In one or more implementations, Csw1 406 may be used for DC de-coupling of a wireless signal that is filtered by the components of system 400.

Figure 5A:
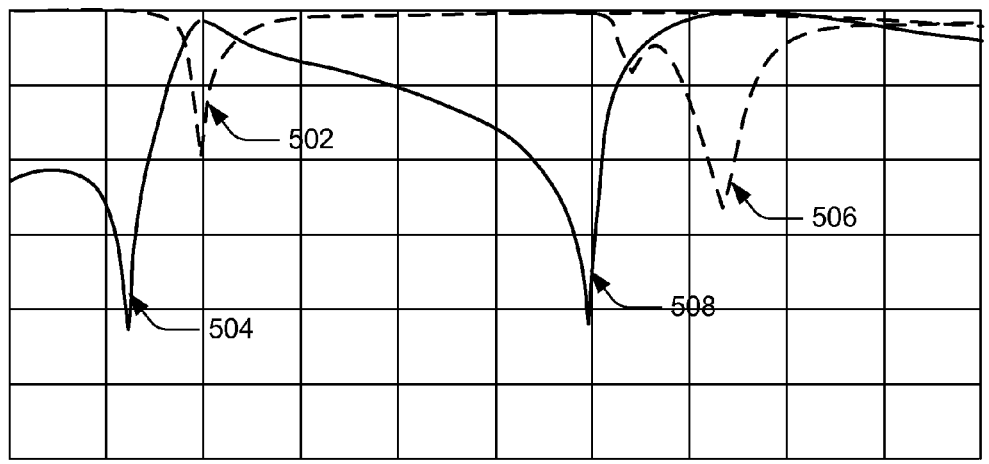
FIG. 5A is an illustration of a filter response in an example implementation showing different frequencies to which the filter is tunable.
Figure 5B:
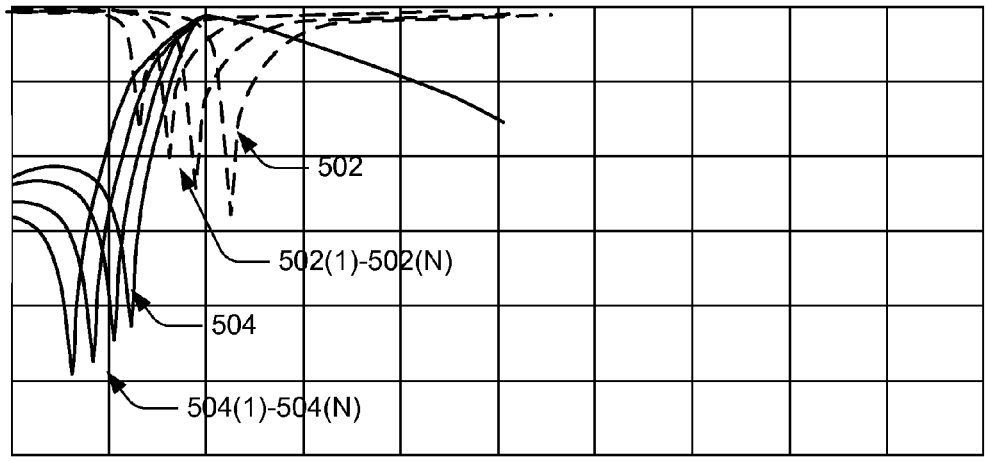
FIG. 5B is an illustration of a filter response in an example implementation that shows tuning to frequencies within a low frequency band.
Figure 5C:
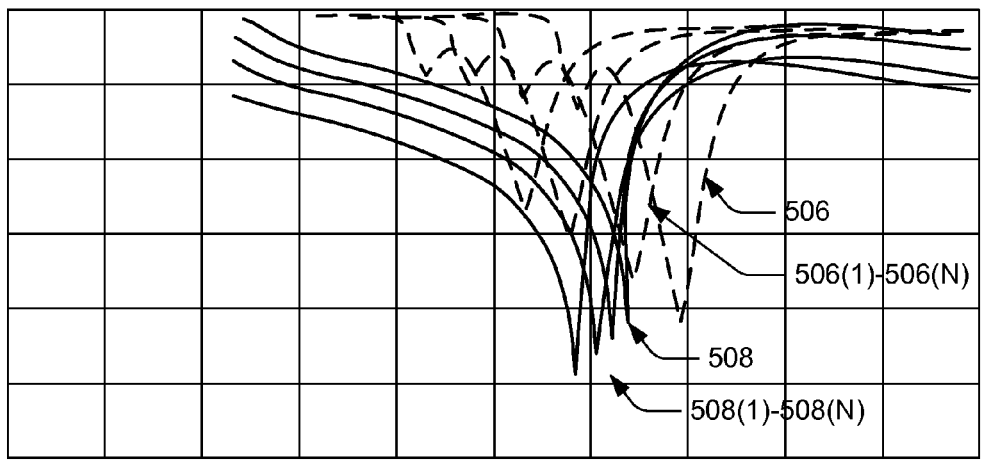
FIG. 5C is an illustration of a filter response in an example implementation that shows tuning to frequencies within a high frequency band.

FIGS. 5A-5C each illustrate filter responses for a reconfigurable multi-band filter, such as a filter having the components illustrated in FIG. 4. FIGS. 5A-5C are each illustrated as including a reflection coefficient in a passband frequency range, e.g., a range of frequencies that are passed through filter 204. Low passband 502, for instance, is formed by Cr1 402 and Ltx1 404 (i.e., by the LC tank) and may be tuned by changing the value of Cr1 402 or Ltx1 404. A low frequency notch 504 is also shown in FIGS. 5A and 5B. Low frequency notch 504 is formed by Csw1 406 and excess reactance (of an inductive nature) from the LC Tank. Still further, FIGS. 5A and 5C are illustrated as including a high passband 506 and a high frequency notch 508 that is formed by inductance of Lswitch 408 and excess reactance (of a capacitive nature) from the LC Tank.

FIG. 5A illustrates the low passband 502, the low frequency notch 504, and the high frequency notch 508, which may be formed by the components of system 400. It should be noted that separation between the low passband 502 and the low frequency notch 504 may be adjusted by changing the value of Csw1 406. For example, by increasing the value of Csw1 406, the low frequency notch 504 formed by the components of system 400 may approach the low passband 502. FIG. 5A also illustrates the high passband 506 that can be formed using the switch.

FIG. 5B is an illustration of a filter response that shows tuning to frequencies within a low frequency band. For example, low passband 502 may be tuned to a variety of frequencies. Thus, FIG. 5B shows such variety of frequencies as additional low passbands 502(1)-502(N), where 'N' represents any number. Additionally, low frequency notch 504 may correspond to a particular frequency within the low frequency band. FIG. 5B also shows additional low frequency notches 504(1)-504(N), where 'N' represents any number. The additional low frequency notches 504(1)-504 (N) may correspond to other frequencies in the low frequency band. By tuning Cr1 402 (e.g., changing its value), the low passband 502 may be adjusted. For example, by increasing Cr1 402, the low passband 502 may be lowered, such as to one of the additional low passbands 502(1)-502 (N). When the low passband 502 is fixed, the low frequency notch 504 may be adjusted. By tuning Ltx1 404 (e.g., changing its value), for instance, the low frequency notch 504 may be adjusted. For example, by increasing Ltx1 404 the low frequency notch may be lowered, such as to one of the additional low frequency notches 504(1)-504(N). Tuning Ltx1 404, however, has little effect on the high frequency notch 508. In this way, the reconfigurable multi-band filter may be tuned to a frequency within the low frequency band separately from tuning to a frequency within a high frequency band.

FIG. 5C is an illustration of a filter response that shows tuning to frequencies within a high frequency band. For example, high passband 506 may be tuned to a variety of frequencies. Thus, FIG. 5C shows such variety of frequencies as additional high passbands 506(1)-506(N). In this example, high frequency notch 508 may correspond to a particular frequency within the high frequency band. FIG. 5C also shows additional high frequency notches 508(1)- 508(N), where 'N' represents any number. In the continuing example, the additional high frequency notches 508(1)-508 (N) may correspond to other frequencies in the high frequency band. By adjusting components of the filter, the high passband 506 may be adjusted, such as to one of the additional high passbands 506(1)-506(N). When the high passband 506 is fixed, high frequency notch 508 may be adjusted by tuning Cr1 402 (e.g., changing its value). By increasing Cr1 402, for instance, the high frequency notch 508 may be lowered, such as to one of the additional high frequency notches 508(1)-508(N). Tuning Cr1 402, however, has little effect on the low frequency notch 504. Thus, the reconfigurable multi-band filter may be tuned to a frequency within the high frequency band separately from tuning to a frequency within the low frequency band. Further discussion of these and other techniques may be found in relation to the following procedure.

Example Procedures

The following discussion describes reconfigurable multi-band filter techniques that may be implemented utilizing previously described systems and devices. Aspects of each of the procedures may be implemented in hardware, firmware, or software, or a combination thereof. The procedures are shown as a set of blocks that specify operations performed by one or more devices and are not necessarily limited to the orders shown for performing the operations by the respective blocks. In portions of the following discussion, reference will be made to the environment 100 of FIG. 1 and the system 200, 300, 400 of FIGS. 2, 3, and 4 respectively.

Figure 6:
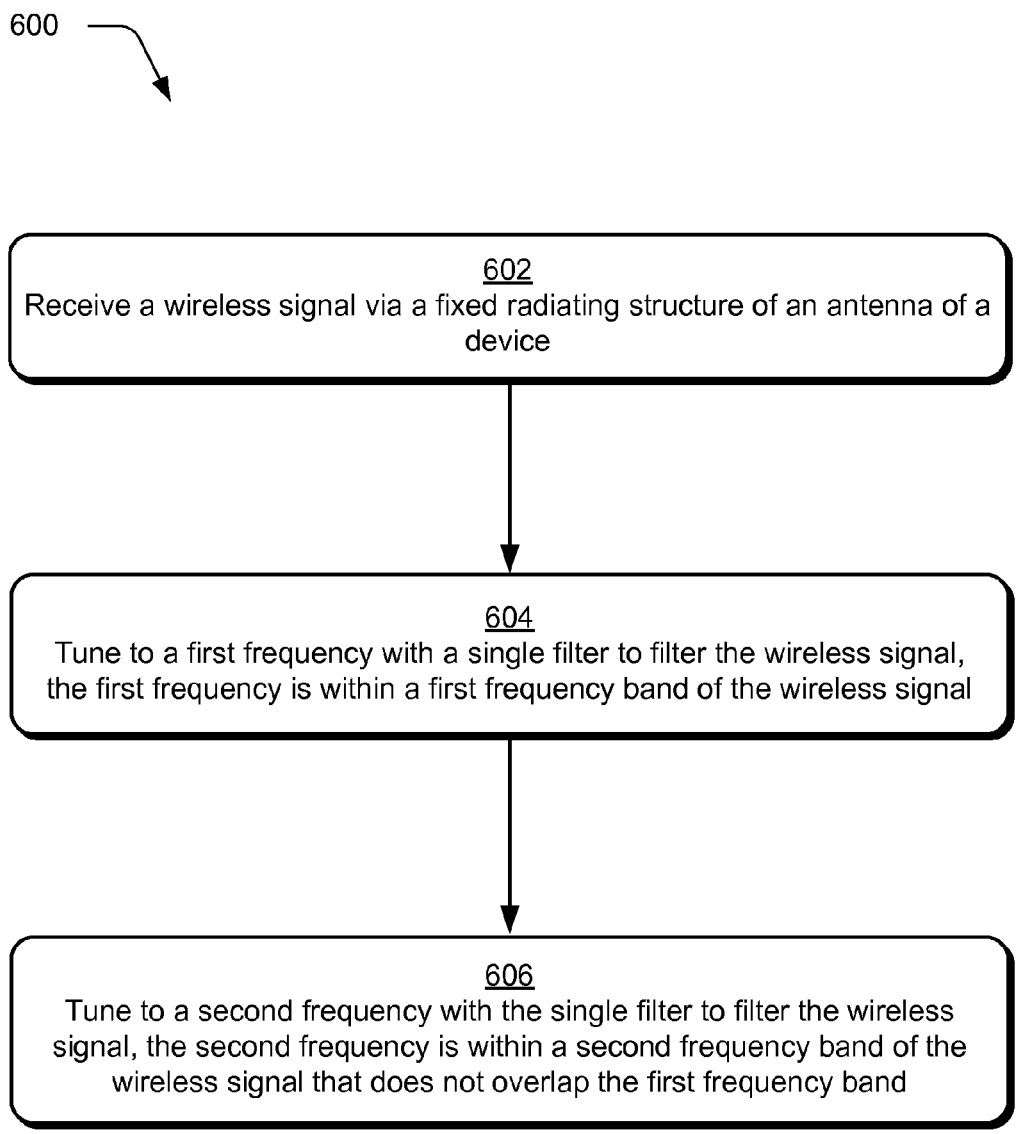
FIG. 6 is a flow diagram depicting a procedure in an example implementation in which a single filter is tuned to a first frequency within a first frequency band to filter a wireless signal and is then tuned to a second frequency within a second frequency band that does not overlap the first frequency band to filter the wireless signal.

FIG. 6. depicts a procedure 600 in an example implementation in which a single filter is tuned to a first frequency within a first frequency band to filter a wireless signal and, is then tuned to a second frequency within a second frequency band that does not overlap the first frequency band to filter the wireless signal. A wireless signal is received via a radiating of an antenna of a device (block 602). For example, the radiating structure 202 of antenna 104 may be used to receive a wireless signal, such as to support a wireless communication technique. In this example, the single filter (e.g., filter 204) may receive the wireless signal from the radiating structure 202 as input, such as at input 302 of FIG. 3.

The single filter may be tuned to a first frequency to filter a wireless signal, such that the first frequency is within a first frequency band of the wireless signal (block 604). For example, the high frequency band resonators 208 may be selected by switches 212 of filter 204 to filter the wireless signal received at block 602. Using tunable capacitors, filter 204 may be tuned to a 'high' frequency within the high frequency band. Filter 204, however, may be configured such that only one frequency may be tuned to at a time. To filter a wireless signal using a different frequency, filter 204 may be reconfigured, such as responsive to activation signals from the logic control module 118.

The single filter may then be tuned to a second frequency to filter the wireless signal, such that the second frequency is within a second frequency band (block 606). In this instance, the second frequency band is different from the first frequency band (e.g., a band that is non-overlapping, separate by an order of magnitude, and so on). Continuing with this example, the switches 212 may be activated to switch from the high frequency band resonators 208 to select the low frequency band resonators 210. Using tunable capacitors, filter 204 may be further tuned to a specific frequency within the low frequency band. Thus, a variety of different wireless signal techniques may leverage the reconfigurable multi-band filter techniques described herein.

Example System and Device

Figure 7:
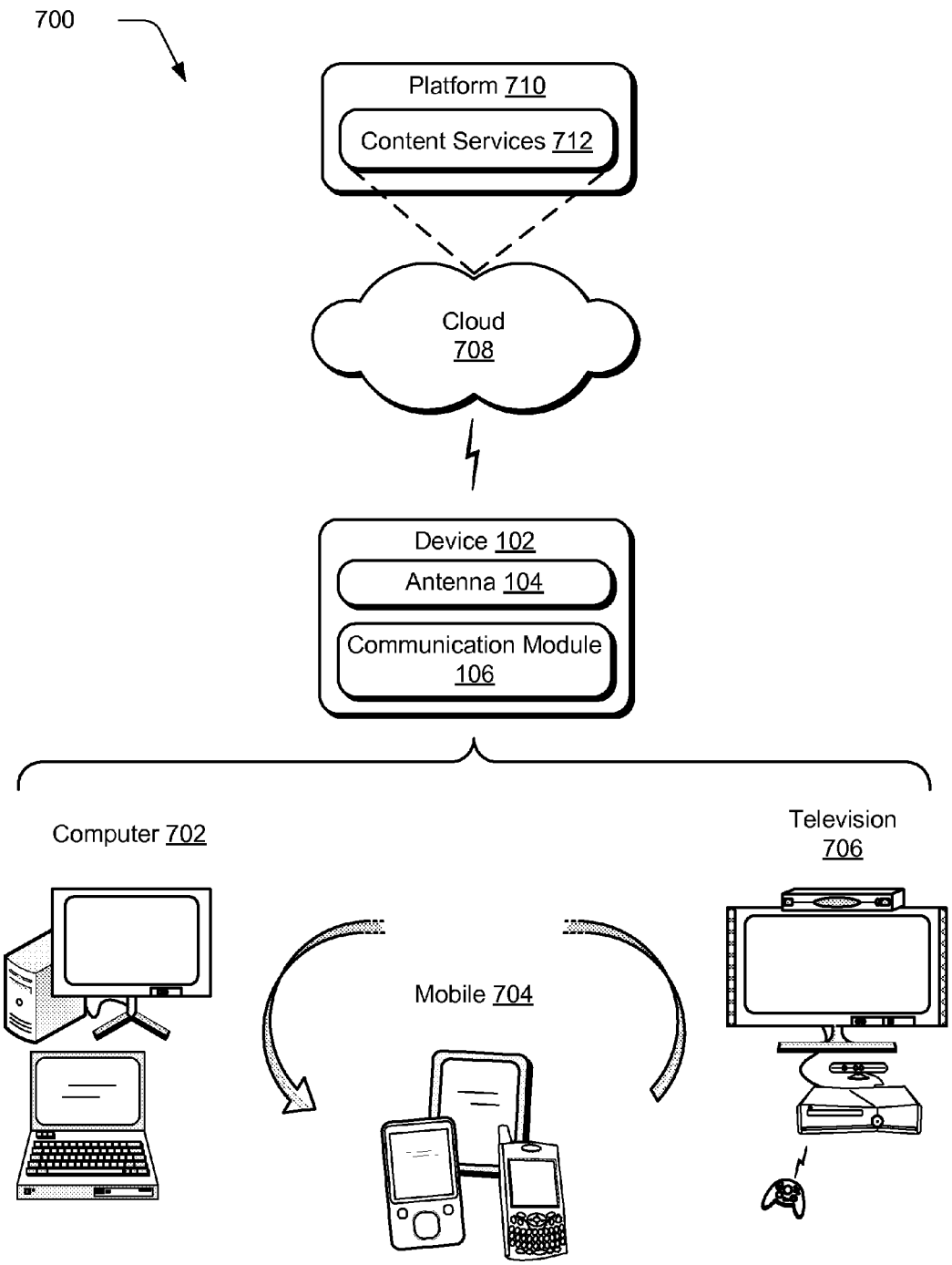
FIG. 7 illustrates an example system that includes the device as described with reference to FIG. 1.

FIG. 7 illustrates an example system 700 that includes the computing device 102 as described with reference to FIG. 1. The example system 700 enables ubiquitous environments for a seamless user experience when running applications on a personal computer (PC), a television device, and/or a mobile device. Services and applications run substantially similar in all three environments for a common user experience when transitioning from one device to the next while utilizing an application, playing a video game, watching a video, and so on.

In the example system 700, multiple devices are interconnected through a central computing device. The central computing device may be local to the multiple devices or may be located remotely from the multiple devices. In one embodiment, the central computing device may be a cloud of one or more server computers that are connected to the multiple devices through a network, the Internet, or other data communication link. In one embodiment, this interconnection architecture enables functionality to be delivered across multiple devices to provide a common and seamless experience to a user of the multiple devices. Each of the multiple devices may have different physical requirements and capabilities, and the central computing device uses a platform to enable the delivery of an experience to the device that is both tailored to the device and yet common to all devices. In one embodiment, a class of target devices is created and experiences are tailored to the generic class of devices. A class of devices may be defined by physical features, types of usage, or other common characteristics of the devices.

In various implementations, the computing device 102 may assume a variety of different configurations, such as for computer 702, mobile 704, and television 706 uses. Each of these configurations includes devices that may have generally different constructs and capabilities, and thus the computing device 102 may be configured according to one or more of the different device classes. For instance, the computing device 102 may be implemented as the computer 702 class of a device that includes a personal computer, desktop computer, a multi-screen computer, laptop computer, netbook, and so on.

The computing device 102 may also be implemented as the mobile 704 class of device that includes mobile devices, such as a mobile phone, portable music player, portable gaming device, a tablet computer, a multi-screen computer, and so on. The computing device 102 may also be implemented as the television 706 class of device that includes devices having or connected to generally larger screens in casual viewing environments. These devices include televisions, set-top boxes, gaming consoles, and so on. The techniques described herein may be supported by these various configurations of the computing device 102 and are not limited to the specific examples the techniques described herein.

The cloud 708 includes and/or is representative of a platform 710 for content services 712. The platform 710 abstracts underlying functionality of hardware (e.g., servers) and software resources of the cloud 708. The content services 712 may include applications and/or data that can be utilized while computer processing is executed on servers that are remote from the computing device 102. Content services 712 can be provided as a service over the Internet and/or through a subscriber network, such as a cellular or Wi-Fi network.

The platform 710 may abstract resources and functions to connect the computing device 102 with other computing devices. The platform 710 may also serve to abstract scaling of resources to provide a corresponding level of scale to encountered demand for the content services 712 that are implemented via the platform 710. Accordingly, in an interconnected device embodiment, implementation of the functionality described herein may be distributed throughout the system 700. For example, the functionality may be implemented in part on the computing device 102 as well as via the platform 710 that abstracts the functionality of the cloud 708.

Figure 8:
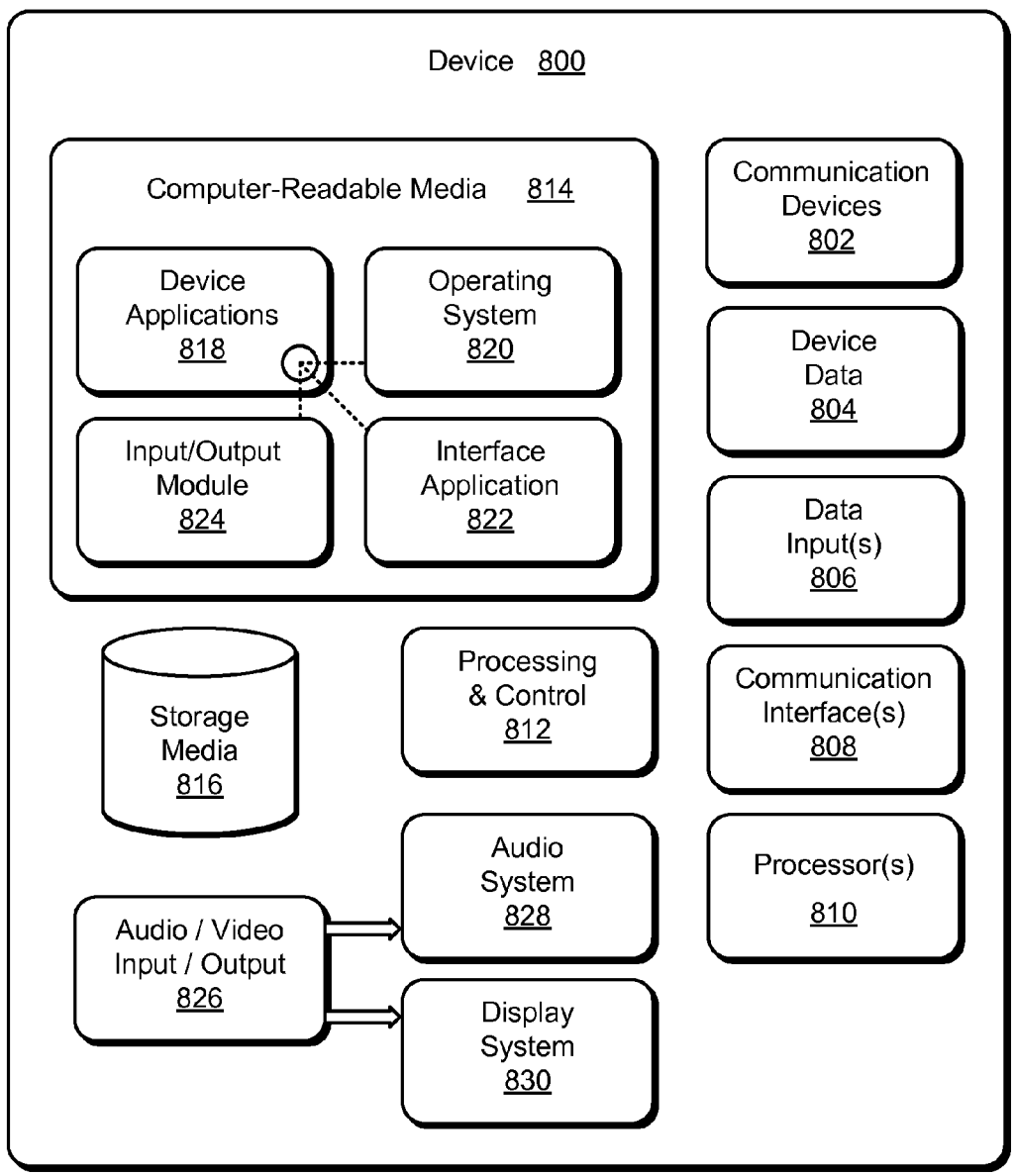
FIG. 8 illustrates various components of an example device that can be implemented as any type of device as described with reference to FIGS. 1-5C and 7 to implement embodiments of the techniques described herein.

FIG. 8 illustrates various components of an example device 800 that can be implemented as any type of computing device as described with reference to FIGS. 1, 2, and 7 to implement embodiments of the techniques described herein. Device 800 includes communication devices 802 that enable wired and/or wireless communication of device data 804 (e.g., received data, data that is being received, data scheduled for broadcast, data packets of the data, etc.). The device data 804 or other device content can include configuration settings of the device, media content stored on the device, and/or information associated with a user of the device. Media content stored on device 800 can include any type of audio, video, and/or image data. Device 800 includes one or more data inputs 806 via which any type of data, media content, and/or inputs can be received, such as user selectable inputs, messages, music, television media content, recorded video content, and any other type of audio, video, and/or image data received from any content and/or data source.

Device 800 also includes communication interfaces 808 that can be implemented as any one or more of a serial and/or parallel interface, a wireless interface, any type of network interface, a modem, and as any other type of communication interface. The communication interfaces 808 provide a connection and/or communication links between device 800 and a communication network by which other electronic, computing, and communication devices communicate data with device 800.

Device 800 includes one or more processors 810 (e.g., any of microprocessors, controllers, and the like) which process various computer-executable instructions to control the operation of device 800 and to implement embodiments of the techniques described herein. Alternatively or in addition, device 800 can be implemented with any one or combination of hardware, firmware, or logic circuitry that is implemented in connection with processing and control circuits which are generally identified at 812. Although not shown, device 800 can include a system bus or data transfer system that couples the various components within the device. A system bus can include any one or combination of different bus structures, such as a memory bus or memory controller, a peripheral bus, a universal serial bus, and/or a processor or local bus that utilizes any of a variety of bus architectures.

Device 800 also includes computer-readable media 814, such as one or more memory components, examples of which include random access memory (RAM), non-volatile memory (e.g., any one or more of a read-only memory (ROM), flash memory, EPROM, EEPROM, etc.), and a disk storage device. A disk storage device may be implemented as any type of magnetic or optical storage device, such as a hard disk drive, a recordable and/or rewriteable compact disc (CD), any type of a digital versatile disc (DVD), and the like. Device 800 can also include a mass storage media device 816.

Computer-readable media 814 provides data storage mechanisms to store the device data 804, as well as various device applications 818 and any other types of information and/or data related to operational aspects of device 800. For example, an operating system 820 can be maintained as a computer application with the computer-readable media 814 and executed on processors 810. The device applications 818 can include a device manager (e.g., a control application, software application, signal processing and control module, code that is native to a particular device, a hardware abstraction layer for a particular device, etc.). The device applications 818 also include any system components or modules to implement embodiments of the techniques described herein. In this example, the device applications 818 include an interface application 822 and an input/output module 824 that are shown as software modules and/or computer applications. The input/output module 824 is representative of software that is used to provide an interface with a device configured to capture inputs, such as a touchscreen, track pad, camera, microphone, and so on. Alternatively or in addition, the interface application 822 and the input/output module 824 can be implemented as hardware, software, firmware, or any combination thereof. Additionally, the input/output module 824 may be configured to support multiple input devices, such as separate devices to capture visual and audio inputs, respectively.

Device 800 also includes an audio and/or video input-output system 826 that provides audio data to an audio system 828 and/or provides video data to a display system 830. The audio system 828 and/or the display system 830 can include any devices that process, display, and/or otherwise render audio, video, and image data. Video signals and audio signals can be communicated from device 800 to an audio device and/or to a display device via an RF (radio frequency) link, S-video link, composite video link, component video link, DVI (digital video interface), analog audio connection, or other similar communication link. In an embodiment, the audio system 828 and/or the display system 830 are implemented as external components to device 800. Alternatively, the audio system 828 and/or the display system 830 are implemented as integrated components of example device 800.

CONCLUSION

Although the invention has been described in language specific to structural features and/or methodological acts, it is to be understood that the invention defined in the appended claims is not necessarily limited to the specific features or acts described. Rather, the specific features and acts are disclosed as example forms of implementing the claimed invention.

What is claimed is:

1. A device comprising:
 a radiating structure configured to receive a wireless signal for a plurality of different wireless communication techniques in different frequency bands; and
 a single filter configured to tune to frequencies within the different frequency bands and receive the wireless signal from the radiating structure at a first port and to output a filtered wireless signal at a second port, the single filter comprising:
  a single radio frequency path between the first port and the second port, the single radio frequency path comprising:
   a first capacitor connected between the first port and a common capacitor; and
   a second capacitor connected between the common capacitor and the second port;
  a plurality of selectable individual resonant structures configured to pass different passband frequencies, the different passband frequencies being adjustable within the different frequency bands associated with the resonant structures,
  the plurality of selectable individual resonant structures including a first set of the selectable resonant structures and a second set of set of selectable resonant structures,
  wherein a single one of the resonant structures in the first set of resonant structures is selectively connectable at a time between a first node in the single radio frequency path and ground, the first node between the first capacitor and the common capacitor, and
  wherein a single one of the resonant structures in the second set of resonant structures is selectively connectable at a time between a second node in the single radio frequency path and ground, the second node between the common capacitor and the second capacitor; and
  tunable capacitors configured to adjust the passband frequencies of the resonant structures.

2. A device as described in claim 1, wherein the single filter is reconfigurable to switch from passing a first said frequency passband within a first said different frequency band to subsequently passing a second said frequency passband within a second said different frequency band.

3. A device as described in claim 1, wherein the single filter is reconfigurable to switch from passing a first said frequency passband within a first said different frequency band to subsequently passing a second said frequency passband within the first said different frequency band.

4. A device as described in claim 1, further comprising a logic control module configured to activate the resonant structures to pass the different passband frequencies within the different frequency bands.

5. A device as described in claim 4, wherein the logic control module is further configured to activate the tunable capacitors to adjust the different passband frequencies within the different frequency bands.

6. A device as described in claim 1, wherein:
 the selectable individual resonant structures comprise one or more low band resonant structures configured to pass passband frequencies within a first said different frequency band and one or more high band resonant structures configured to pass passband frequencies within a second said different frequency band; and the first said different frequency band covers a lower range of frequencies than the second said different frequency band.

7. A device as described in claim 1, wherein the filter is configured to output the filtered wireless signal without using additional filters.

8. A device as described in claim 1, wherein the single filter further comprises one or more switches configured to select between the plurality of selectable individual resonant structures.

9. A device as described in claim 8, wherein the one or more switches are XPXT (multiple pole, multiple throw) switches.

10. A method for use with a single filter including a first set of selectable resonant structures, a second set of selectable resonant structures, and tunable capacitors, the method comprising:

coarse tuning the single filter to a first frequency band by selecting a first one of the resonant structures in the first set of resonant structures and a first one of the resonant structures in the second set of resonant structures;

fine tuning the single filter to a particular frequency within the first frequency band using the tunable capacitors;

filtering a first wireless signal, received via a radiating structure, with the single filter course tuned to the first frequency band and fine tuned to the particular frequency within the first frequency band, to thereby produce a first filtered signal;

coarse tuning the single filter to a second frequency band by selecting a second one of the resonant structures in the first set of resonant structures and a second one of the resonant structures in the second set of resonant structures;

fine tuning the single filter to a particular frequency within the second frequency band using the tunable capacitors; and filtering a second wireless signal, received via the radiating structure, with the single filter course tuned to the second frequency band and fine tuned to the particular frequency within the second frequency band, to thereby produce a second filtered signal.

11. A method as described in claim 10, wherein the single filter has a first adjustable notch frequency response and a second adjustable notch frequency response.

12. A method as described in claim 10, wherein the radiating structure is part of an antenna of a mobile phone or tablet.

13. A method as described in claim 10, wherein the first frequency band represents frequencies that are lower than frequencies represented by the second frequency band.

14. A method as described in claim 10, wherein the first frequency band represents frequencies that are higher than frequencies represented by the second frequency band.

15. A method as described in claim 10, wherein the course tuning to the first frequency and the course tuning to the second frequency are performed one at a time.

16. The method of claim 10, wherein:

the single filter includes a single signal path between an input and an output of the single filter;

the coarse tuning the single filter to the first frequency band includes shunt connecting the first one of the resonant structures in the first set of resonant structures to a first node in the single signal path and shunt connecting the first one of the resonant structures in the second set of resonant structures to a second node in the signal path; and the coarse tuning the single filter to the second frequency band includes shunt connecting the second one of the resonant structures in the first set of resonant structures to the first node in the single signal path and shunt connecting the second one of the resonant structures in the second set of resonant structures to the second node in the signal path.

17. An apparatus comprising:

an antenna including a radiating structures;

a single filter, which is configured to tune to frequencies within different frequency bands, wherein the single filter is communicatively connected to the radiating structure; and a logic control module that is coupled to the single filter; the single filter including a single signal path between an input and an output of the single filter;

a first set of selectable resonant structures;

a second set of selectable resonant structures; and tunable capacitors;

the logic control module a configured to selectively shunt connect one of the selectable resonant structures in the first set of selectable resonant structures to a first node of the single signal path, and selectively shunt connect one of the selectable resonant structures in the second set of selectable resonant structures to a second node of the single signal path, to thereby tune to the different frequency bands, and adjust the tunable capacitors to tune to the frequencies within the frequency bands.

18. An apparatus as described in claim 17, wherein the single filter is further configured to receive a wireless signal via the radiating structure and to output a filtered wireless signal without using additional filters.

19. An apparatus as described in claim 17, wherein the selectable resonant structures in the first and second sets of selectable resonant structures comprise low band resonant structures and high band resonant structures, the low band resonant structures configured to tune to said different frequency bands that are lower than the high band resonant structures.

* * * * *